(12) United States Patent
Cheng et al.

(10) Patent No.: US 11,685,306 B2
(45) Date of Patent: Jun. 27, 2023

(54) LIGHT EMITTING DEVICE

(71) Applicant: LITE-ON TECHNOLOGY CORPORATION, Taipei (TW)

(72) Inventors: Wei-Te Cheng, Taipei (TW); Kai-Chieh Liang, Taipei (TW); Kuo-Ming Chiu, Taipei (TW); Fang-Jung Sun, Taipei (TW); Chun-Chieh Chang, Taipei (TW); Yi-Fei Lee, Taipei (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 17/584,164

(22) Filed: Jan. 25, 2022

(65) Prior Publication Data

US 2022/0243897 A1    Aug. 4, 2022

Related U.S. Application Data

(60) Provisional application No. 63/144,962, filed on Feb. 2, 2021.

(30) Foreign Application Priority Data

Nov. 22, 2021    (CN) .......................... 202111401493.6

(51) Int. Cl.
| | | |
|---|---|---|
| *B60Q 1/30* | (2006.01) | |
| *F21S 43/14* | (2018.01) | |
| *B60Q 1/26* | (2006.01) | |
| *F21S 43/20* | (2018.01) | |
| *B60Q 1/44* | (2006.01) | |
| *H01L 25/13* | (2006.01) | |
| *F21V 9/30* | (2018.01) | |
| *H01L 33/10* | (2010.01) | |
| *H01L 33/38* | (2010.01) | |
| *H01L 33/56* | (2010.01) | |
| *H01L 33/62* | (2010.01) | |
| *F21Y 115/10* | (2016.01) | |

(52) U.S. Cl.
CPC ............. *B60Q 1/30* (2013.01); *B60Q 1/2607* (2013.01); *B60Q 1/44* (2013.01); *F21S 43/14* (2018.01); *F21S 43/255* (2018.01); *F21V 9/30* (2018.02); *H01L 25/13* (2013.01); *H01L 33/10* (2013.01); *H01L 33/382* (2013.01); *H01L 33/56* (2013.01); *H01L 33/62* (2013.01); *F21Y 2115/10* (2016.08)

(58) Field of Classification Search
CPC .......... B60Q 1/30; B60Q 1/2607; B60Q 1/44; F21S 43/14; F21S 43/255; F21V 9/30; H01L 25/13; H01L 33/382; H01L 33/56; H01L 33/62; F21Y 2115/10
See application file for complete search history.

(56) References Cited

U.S. PATENT DOCUMENTS

2012/0087103 A1* 4/2012 Dai .......................... F21V 5/10
362/355

* cited by examiner

*Primary Examiner* — Andrew J Coughlin
*Assistant Examiner* — Jessica M Apenteng
(74) *Attorney, Agent, or Firm* — Innovation Counsel LLP

(57) ABSTRACT

A light emitting device including a lighting unit and a conversion material is disclosed. The conversion material is configured to convert a part of the invisible light emitted from the lighting unit into a visible light, which indicates that the lighting unit is in operation. The spectral energy of visible light is less than 20% of the spectral energy measured within a wavelength range of 200 nm to 380 nm.

20 Claims, 6 Drawing Sheets

| Device | Example 1 | Example 2 | Embodiment 1 | Embodiment 2 | Embodiment 3 | Embodiment 4 |
|---|---|---|---|---|---|---|
| Encapsulant type | | Type W | Type W | Type F | Type F | Type F |
| Conversion material | | | Yes | | Yes | |
| Phosphor content (%) | 0% | 0% | 10% | 10% | 20% | 30% |
| Spectral energy of visible light (A) mW | - | - | 1.42 | 0.80 | 1.11 | 1.47 |
| Spectral energy of invisible light (B) mW | 9.6 | 10.6 | 10.3 | 10.1 | 9.8 | 9.0 |
| Ratio (With conversion material/Without conversion material) | 100% | 110.4% | 107.3% | 105.2% | 102.1% | 93.8% |

FIG. 2

| UV light + blue phosphor | | | |
|---|---|---|---|
| Phosphor content | Spectral energy of invisible light B (mW) | Spectral energy of visible light A (mW) | Ratio (A/B) |
| 5% | 5.76 | 0.35 | 6.08% |
| 10% | 5.68 | 0.39 | 6.87% |
| 15% | 5.62 | 0.42 | 7.47% |
| 20% | 5.49 | 0.48 | 8.74% |

| UV light + green phosphor |||| 
| Phospher content | Spectral energy of invisible light B (mW) | Spectral energy of visible light A (mW) | Ratio (A/B) |
| --- | --- | --- | --- |
| 5% | 5.82 | 0.16 | 2.75% |
| 10% | 5.72 | 0.24 | 4.20% |
| 15% | 5.48 | 0.31 | 5.66% |
| 20% | 5.15 | 0.34 | 6.60% |

| UV light + red phosphor ||||
| Phosher content | Spectral energy of invisible light B (mW) | Spectral energy of visible light A (mW) | Ratio (A/B) |
| --- | --- | --- | --- |
| 0.5% | 5.83 | 0.05 | 0.86% |
| 3.0% | 5.74 | 0.17 | 2.96% |
| 5.0% | 5.63 | 0.26 | 4.62% |
| 7.0% | 5.49 | 0.32 | 5.83% |

LIGHT EMITTING DEVICE

This application claims the benefits of U.S. provisional application Ser. No. 63/144,962, filed Feb. 2, 2021 and People's Republic of China application Serial No. 202111401493.6, filed Nov. 22, 2021, the subject matters of which are incorporated herein by reference.

BACKGROUND OF THE INVENTION

Field of the Invention

The invention relates in general to a light emitting device, and more particularly to a light emitting device capable of emitting an invisible light and a visible light at the same time.

Description of the Related Art

In the application of ultraviolet (UV) light, since the UV light is invisible to human eyes, a blue light LED is additionally disposed in the light emitting device to provide a blue light by which the user can directly determine whether the UV LED is in operation or not. Since the arrangement of blue light LED increases the cost, heat generation and power consumption of the light emitting device, it needs to be further improved.

SUMMARY OF THE INVENTION

The invention is directed to a light emitting device capable of converting a part of an invisible light (such as a deep ultraviolet light) into a visible light, which indicates that the lighting unit is in operation, so that the cost, heat generation and power consumption of blue light LED can be reduced.

According to one embodiment of the present invention, a light emitting device is provided. The light emitting device includes a lighting unit and a conversion material. The lighting unit is configured to emit an invisible light. The conversion material is configured to convert a part of the invisible light into a visible light for indicating that the lighting unit is in operation. The light emitted by the light emitting device covers both wavelength ranges of the visible light and the invisible light. The spectral energy measured within the wavelength range of the visible light is less than 20% of the spectral energy measured within a wavelength range of 200 nm to 380 nm.

According to another embodiment of the present invention, an invisible light emitting device is provided. The invisible light emitting device includes a lighting unit and a conversion material. The lighting unit is configured to emit a first light. The conversion material surrounds the lighting unit and has an excitation spectrum, wherein when a part of the first light enters the conversion material, the conversion material converts the part of the first light into a second light. The first light is an invisible light, and the second light is a visible light. The spectral energy of the first light is at least 5 times of the spectral energy of the second light.

The above and other aspects of the invention will become better understood with regard to the following detailed description of the preferred but non-limiting embodiment(s). The following description is made with reference to the accompanying drawings.

BRIEF DESCRIPTION OF THE DRAWINGS

FIG. 2 is a comparison diagram of spectral energies and phosphor contents of light emitting devices according to an embodiment of the present invention.

DETAILED DESCRIPTION OF THE INVENTION

Detailed descriptions of the invention are disclosed below with a number of embodiments. However, the disclosed embodiments are for explanatory and exemplary purposes only, not for limiting the scope of protection of the invention.

Figure 1A:
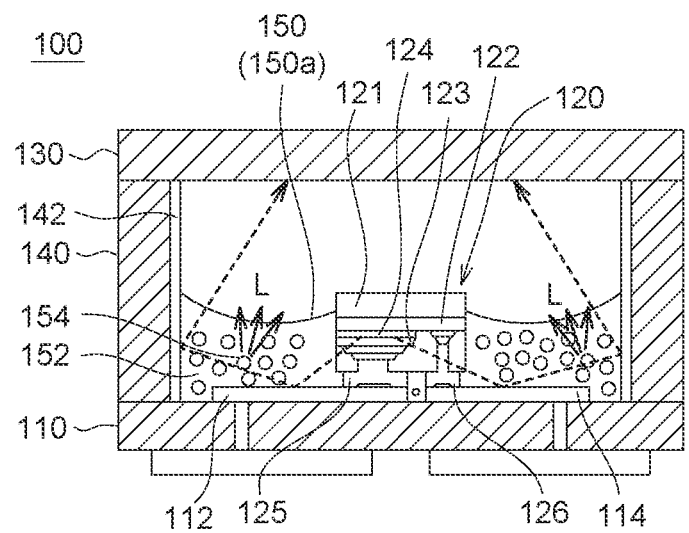
FIG. 1A and FIG. 1B respectively are cross-sectional views of a light emitting device according to an embodiment of the present invention.
Figure 1B:
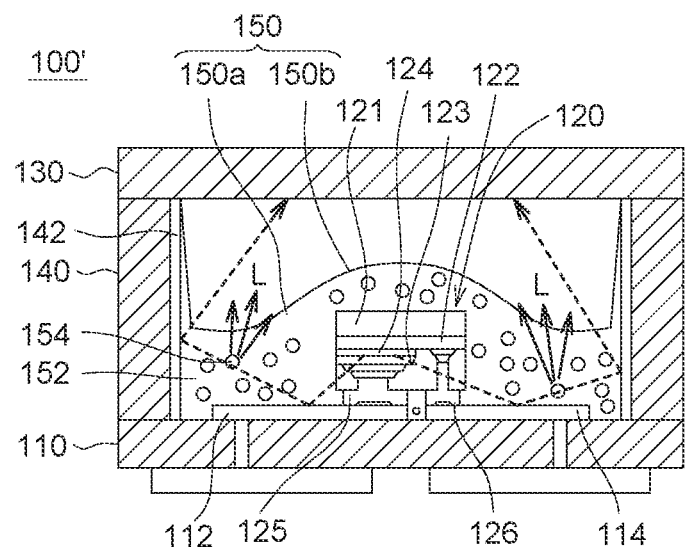

FIG. 1A and FIG. 1B respectively are a cross-sectional view of a light emitting devices 100 and a cross-sectional view of a light emitting devices 100' according to an embodiment of the present invention. The light emitting devices 100 and 100' of the present embodiment can be used in many application fields such as photo curing, exposure and development, water purification and sterilization, and medical treatment. The light source can be a deep ultraviolet (deep UV) LED whose peak is within the range of 200 nm-380 nm. The UV light can excite a phosphor 154 to generate a visible light L with wavelength of 380 nm-780 nm, such as a blue light with wavelength of 450 nm-495 nm, a green light with wavelength of 495 nm-570 nm, a yellow light with wavelength of 570 nm-590 nm or a red light with wavelength of 620 nm-740 nm, but the present invention is not limited thereto. As illustrated in the diagrams, solid arrows represent visible light L, dotted arrow represent invisible light, and the invisible light can be outputted via the front side (that is, via the carrier) of the lighting unit 120.

Refer to FIG. 1A and FIG. 1B. Each of the light emitting devices 100 and 100' includes a substrate 110, a lighting unit 120, a cover plate 130, a casing 140 and a conversion material 150. The substrate 110 can be made by a printed circuit board, a package carrier, a ceramic substrate or a copper substrate. The lighting unit 120 is disposed on the substrate 110 and is electrically connected to the substrate 110 in a flip chip manner. The lighting unit 120 is configured to emit an invisible light. The invisible light can be a deep ultraviolet light with wavelength less than 280 nm. In an embodiment, depend on the thickness of the carrier 121, the pattern of the invisible light provided by the lighting unit 120 can be Lambertian or wing-shaped. For example, as the thickness of the carrier 121 is 100-250 microns, the pattern of the invisible light is Lambertian. As the thickness of the carrier 121 is 250-600 microns, the pattern of the invisible light is batwing shaped, the spectral energy of light at normal line is less than the spectral energies of the light at the two lateral sides. The central spectral energy is less than or equal to 90% of the lateral spectral energy, preferably less than 85%. The view angle of the lighting unit 120 is preferably between 110 and 170 degrees.

Especially for high Al-content AlGaN QWs for deep ultraviolet chip, dominants transitions are between a conduction band and a crystal-field split-off hole (CH) band with dominant TM polarized spontaneous emission, thus the thicker carrier 121, the higher light output for the side surface for the carrier 121 based on unique optical polarization properties.

The lighting unit 120 can be formed by an epitaxial layer grown on a carrier 121 by way of metal organic chemical vapor phase deposition (MOCVD). The carrier 121 can be light substrate such as sapphire, gallium nitride (GaN), silicon (Si) or silicon carbide (SiC) and has a thickness of 100-600 microns. The lighting unit 120 includes a carrier 121, a first semiconductor layer 122, a second semiconductor layer 123 and a light emitting layer 124. The first semiconductor layer 122 can be a n-type semiconductor layer doped with an impurity such as silicon and the second semiconductor layer 123 can be a p-type semiconductor layer doped with an impurity such as magnesium, such that the first semiconductor layer 122 and the second semiconductor layer 123 have different electrical properties. The light emitting layer 124 is staggered with the first semiconductor layer 122 and the second semiconductor layer 123 and is located between the first semiconductor layer 122 and the second semiconductor layer 123. The light emitting layer 124 has a multi-quantum well (MQW) structure. When the light emitting layer 124 is formed of aluminum nitride (AlN), aluminum gallium nitride (AlGaN) or aluminum indium gallium nitride (AlGaInN) and the likes, the light emitting layer 124 can emit a deep ultraviolet light with wavelength less than 280 nm or a UV light with other wavebands. However, the material of the light emitting layer 124 is not limited to the above exemplifications, and can be selected a material other than the III-V group of semiconductor to generate an invisible light with other wavebands. Besides, the light emitting layer 124 can be formed of a semiconductor not doped with any impurities, doped with p-type impurity or doped with n-type impurity.

The first electrode 125 and the second electrode 126 can be formed of copper or aluminum. The interface between the first electrode 125 and the first semiconductor layer 122 and the interface between the second electrode 126 and the second semiconductor layer 123 both can contain metal or metal oxide, such as silver (Ag), aluminum (Al), gold (Au), titanium (Ti), copper (Cu), platinum (Pt), nickel (Ni) or rhodium (Rh) or an alloy thereof. The metal oxide can be indium tin oxide (ITO), zinc oxide (ZnO), indium oxide (InO), tin oxide (SnO), indium zinc oxide (IZO) or zinc gallium oxide (GZO) or a combination thereof. The first electrode 125 and the second electrode 126 are electrically connected to the pads 112 and 114 opposite to the substrate 110, so that the lighting unit 120 can receive an external current and emit a light.

Refer to FIG. 1A and FIG. 1B. The cover plate 130 covers the lighting unit 120. The cover plate 130 is formed of a transparent material and can be made by, for example, a quartz substrate, a glass substrate or a plastic substrate, so that the emitted light of the lighting unit 120 can pass through the cover plate 130. Moreover, the casing 140 is interposed between the substrate 110 and the cover plate 130. The lighting unit 120 is located at a space surrounded by the casing 140, so that moisture or heat will not infiltrate and affect the lighting unit 120. The casing 140 can be formed of a thermosetting resin, and the casing with a grid arrangement and the substrate 110 having several lighting units 120 are divided into a plurality of individual light emitting devices. In another embodiment, the casing 140 can be formed of copper, aluminum or other metal, and multiple layers can be placed or electroformed on the substrate 110. Alternatively, the substrate 110 and the casing 140 can be a single piece formed by high temperature co-fired ceramic (HTCC) technology or low temperature co-fired ceramic (LTCC) technology, but the present invention is not limited thereto. The casing 140 substantially has an annular shape. The top edge of the casing 140 is higher than the top surface of the lighting unit 120.

Refer to FIG. 1A and FIG. 1B. In an embodiment, each of the light emitting devices 100 and 100' further includes a reflective layer 142 for increasing the spectral energy of the lighting unit 120. The reflective layer 142 can be disposed on the inner-wall of the casing 140 and/or two pads 112 and 114 of the opposite substrate 110, so that the light at the space surrounded by the casing 140 can be reflected towards the light outputting side (that is, the cover plate 130) by the reflective layer 142. In an embodiment, the reflective layer 142 can be formed of gold or silver, wherein the reflectivity of gold against visible light (such as greater than 78%) is greater than the reflectivity of gold against invisible light (such as less than 38%); the reflectivity of silver against visible light (such as greater than 88%) is greater than the reflectivity of silver against invisible light (such as less than 24%). Refer to Table 1 below.

TABLE 1

| Reflectivity based on 275 nm-660 nm wavelength | | | | |
|---|---|---|---|---|
| Material | 275 nm | 470 nm | 540 nm | 660 nm |
| Gold | 38% | 38% | 78% | 96% |
| Silver | 24% | 88% | 92% | 94% |

Additionally, the reflective layer 142 can be formed by a Bragg reflector having a high reflectivity against the light with a specific wavelength. The Bragg reflector is formed of two or more than two materials with different levels of reflectivity for reflecting a visible light with specific wavelength, such as blue light, green light, yellow light or red light, converted from an invisible light to increase the spectral energy of the lighting unit 120.

Refer to FIG. 1A and FIG. 1B. The conversion material 150 is disposed in the space surrounding the lighting unit 120 for exciting a part of the invisible light as a visible light. The conversion material 150 contains a phosphor 154 located within an encapsulant 152. The content of phosphor 152 in the conversion material 150 is 1% to 35%. The phosphor 154 can absorb a deep ultraviolet light and a near-ultraviolet light. The commonly used phosphor can be selected from a group composed of aluminate, such as garnet series materials, silicate series materials, nitride series materials, phosphate series materials, sulfide series materials, or scandium salt, such as $(Sr,Ba)_{10}(PO_4)_6Cl_2$:Eu, $(Ba,Sr,Ca)_2SiO_4$:$Eu^{2+}$, $Tb_3Al_5O_{12}$:$Ce^{3+}$, $(Sr,Ca)AlSiN_3$: Eu, or other compounds, and the present invention is not limited thereto. The material of the encapsulant 152 can be selected from polydimethylsiloxane or fluorine polymer.

As indicated in FIG. 1A, the conversion material 150 is located at a position higher than that of the light emitting layer (MQW) 124 of the lighting unit 120 but is lower than that of the top of the carrier 121, so that the conversion material 150 covers the periphery of the lighting unit 120 and the top surface of the substrate 110. Furthermore, the lighting unit 120 is located in an accommodating space surrounded by the casing 140. The phosphor 154 in the encapsulant 152 can convert a part of the invisible light into a visible light L. As indicated in FIG. 1A, the top surface of the first portion 150a of the conversion material 150 is substantially flat or is slightly recessed.

In another embodiment, as indicated in FIG. 1B, the conversion material 150 contains a first portion 150a and a second portion 150b. The first portion 150a surrounds the lighting unit 120, the second portion 150b is disposed on the top surface of the lighting unit 120, and a part of the first portion 150a is lower than the top surface of the lighting unit 120. That is, a part of the conversion material 150 is higher than the lighting unit 120, and a part of the conversion material 150 is lower than the lighting unit 120, so that the conversion material 150 is wave-shaped (W shape) and covers the lighting unit 120 and the top surface of the substrate 110. The top surface of the first portion 150a and the top surface of the second portion 150b both are a curved surface, the curved surface of the first portion 150a is recessed, and the curvature center of the top surface of the first portion 150a is located outside the accommodating space defined by the casing 140 and the substrate 110. The highest point of the first portion 150a is located at the junction between the conversion material 150 and the casing 140. The lowest point of the first portion 150a is located at a position from about 25% to 90% of the thickness of the lighting unit 120. The curved surface of the second portion 150b is a convex cone. The top surface of the second portion 150b is relatively lower than the top surface of the casing 140 to avoid the second portion 150b being pressed when the transparent cover plate 130 is attached on the casing 140. In another angle, that is, viewing the longitudinal section of the casing 140 from the height direction, the top edge of the section of the conversion material 150 is substantially W-shaped, and the W shape is formed of the outer surface of the second portion 150b and the top surface of the first portion 150a. Moreover, since the first portion 150a is connected to the bottom edge of the second portion 150b, the designer can adjust the curvature of the top surface of the first portion 150a to fit actual needs. Furthermore, the curvature center of the top surface of the first portion 150a is located outside the accommodating space and preferably is located on the light-emitting path of the lighting unit 120, so that the light emitted from the top surface of the first portion 150a can be collected outside the casing 140 and the lighting unit 120 will not generate several bright spots inside the casing 140.

Since the phosphor 154 of the present embodiment can absorb the light energy of a part of the invisible light to generate a visible light with wavelength of 380 nm-780 nm, the user can determine whether the lighting unit 120 is in operation according to the visible light L without having to additionally install a blue light LED on the light emitting device 100. Thus, the cost, heat generation and power consumption of LED can be reduced. Furthermore, the excitation spectrum of the phosphor 154 must fall within the wavelength range of 200-380 nm; the emission spectrum must fall within the wavelength range of 380-780 nm.

In an embodiment, the spectral energy measured within the wavelength range of visible light can be controlled to be 0.5% to 20% of the spectral energy of invisible light wavelength range (such as 200-380 nm). The spectral energy of visible light is determined according to the content of phosphor 154 in the conversion material 150 and the reflectivity of the reflective layer 142. When the content of phosphor 154 in the conversion material 150 increases and/or the reflectivity of the reflective layer 142 increases, the spectral energy of visible light relatively increases. When the content of phosphor 154 in the conversion material 150 decreases and/or the reflectivity of the reflective layer 142 decreases, the spectral energy of visible light relatively decreases. The content of phosphor 154 in the conversion material 150 is 5% to 30%. For example, the phosphor content for blue light can be 5% to 30%, the phosphor content for green light can be 5% to 25%, the phosphor content for yellow light can be 5% to 35%, and the phosphor content for red light can be 2% to 10%, but the present invention is not limited thereto.

Refer to FIG. 2, a comparison diagram of spectral energies and phosphor contents of light emitting devices 100 and 100' according to an embodiment of the present invention is shown. In FIG. 2, the conversion material 150 can be the F-type as indicated in FIG. 1A (flat or slightly recessed) or the W-type as indicated in FIG. 1B, the content of phosphor 154 can be 0%, 10%, 20% or 30%. The example 1 is: UVC chip with glass cover, no encapsulant and no phosphor is used. The example 2 is: W-type encapsulant, but no phosphor is used. The comparison between embodiment 1 and example 2 shows the introduction of a suitable amount of phosphor powder, despite slightly decreasing the energy intensity of invisible light, provides a recognizable visible light, and the overall spectral energy of embodiment 1 is 1.1 times of example 2. The comparison between embodiment 2 and embodiment 1 shows that with same content of phosphor in the conversion material of F-type encapsulant and W-type encapsulant, the spectral energy A of visible light obtained when the W-type encapsulant is used is more effective and is about 1.78 times of the spectral energy A of visible light obtained when the F-type encapsulant is used. The comparison between embodiment 1 to embodiment 4 and example 1 shows that when a suitable amount of the conversion material is introduced to the F-type and the W-type encapsulant, the overall spectral energy (the spectral energy A of visible light+the spectral energy B of invisible light) is greater than example 1 where no conversion material is used. Furthermore, as the content of phosphor in the conversion material increases, the spectral energy A of visible light increases accordingly, but the spectral energy B of invisible light decreases. Therefore, there is a threshold for the increase in the content of phosphor 154, that is, the increase (ΔA) in the spectral energy A of visible light caused by one percent increase in the content of phosphor powder must be greater than or equivalent to the absolute value of decrease (ΔB) in the spectral energy B of invisible light caused by one percent increase in the content of phosphor powder. The threshold is affected by the type and particle size of the phosphor powder. Let blue phosphor powder be used in the present embodiment. The threshold is reached when the concentration of phosphor powder is 21-22%, the spectral energy A of visible light is about 1.15 mW, and the spectral energy B of invisible light is about 9.72 mW, so that absolute value of the ratio of the increase in the spectral energy A of visible light to the decrease in the spectral energy B of invisible light (ΔA/ΔB) approximates 1. In terms of the overall lighting efficiency, when the blue phosphor is used and the UV light intensity approximates 10 mW, the content of blue phosphor must be controlled to be under 30%, and preferably under 22%. That is, the ratio (A/B) of the spectral energy A of visible light to the spectral energy B of invisible light is controlled to be under 20%. In other words, the spectral energy of UV light is at least 5 times of the spectral energy of blue light, and preferably more than 7.5 times.

Figure 3A:
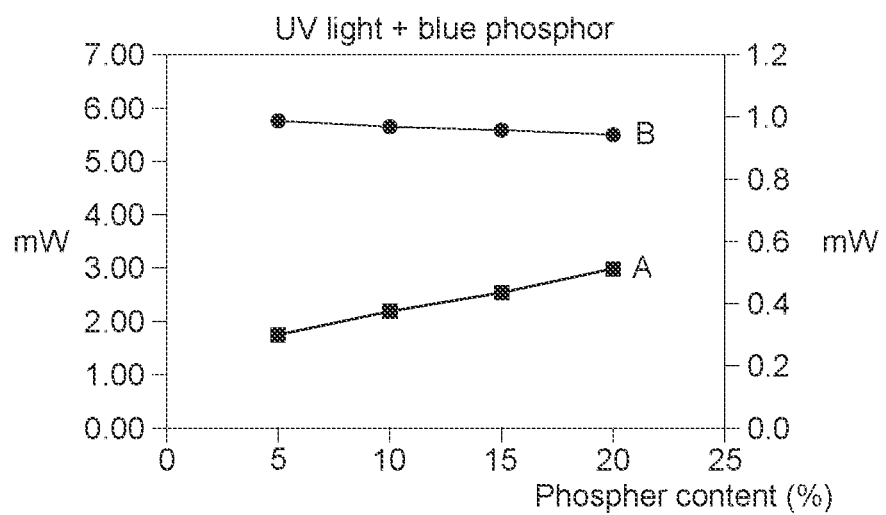
FIG. 3A is a comparison diagram of spectral energies and ratio between an invisible light and a visible light of a light emitting device with different contents of blue phosphor.
Figure 3A:
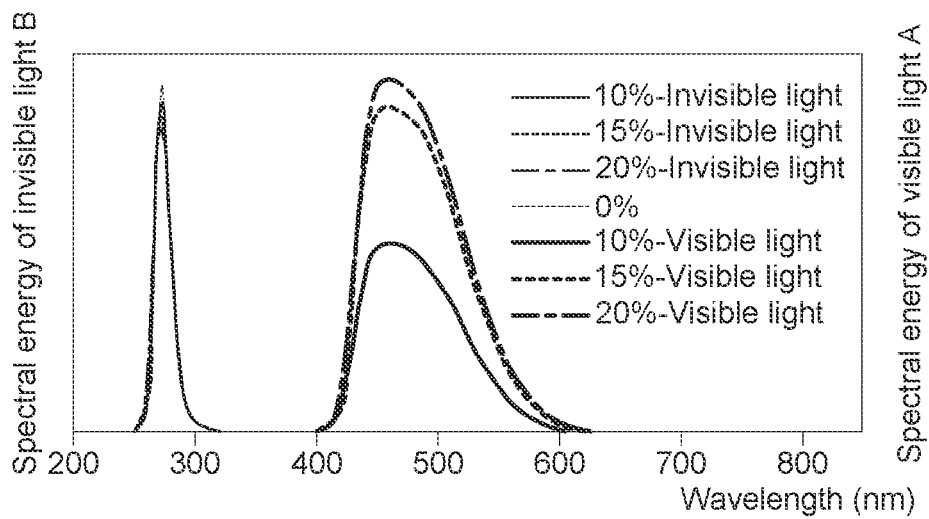

FIG. 3A is a comparison diagram of spectral energies and ratios between an invisible light and a visible light of a light emitting device 100 with different contents of blue phosphor. As indicated in FIG. 3A, blue phosphor can absorb the light energy of UV light waveband to generate a blue light. When the content of blue phosphor is respectively 5%, 10%, 15%, and 20%, the ratio (A/B) of the spectral energy A of visible light (blue light) to the spectral energy B of invisible light is about 6.08%, 6.87%, 7.47%, 8.74%. In terms of overall lighting efficiency, when the blue phosphor is used and the UV light intensity approximates 5-6 mW, the content of blue phosphor must be controlled to be under 20%, preferably not greater than 15%. That is, the ratio (A/B) of the spectral energy A of visible light to the spectral energy B of invisible light is controlled to be under 10%. In other words, the spectral energy of UV light is at least 10 times of the spectral energy of blue light, and preferably more than 15 times. However, for the light to be visible to human eyes, the spectral energy of blue light must be greater than 0.3 mW, and the content of blue phosphor must be controlled to be above 3%, preferably greater than or equivalent to 5%.

Figure 3B:
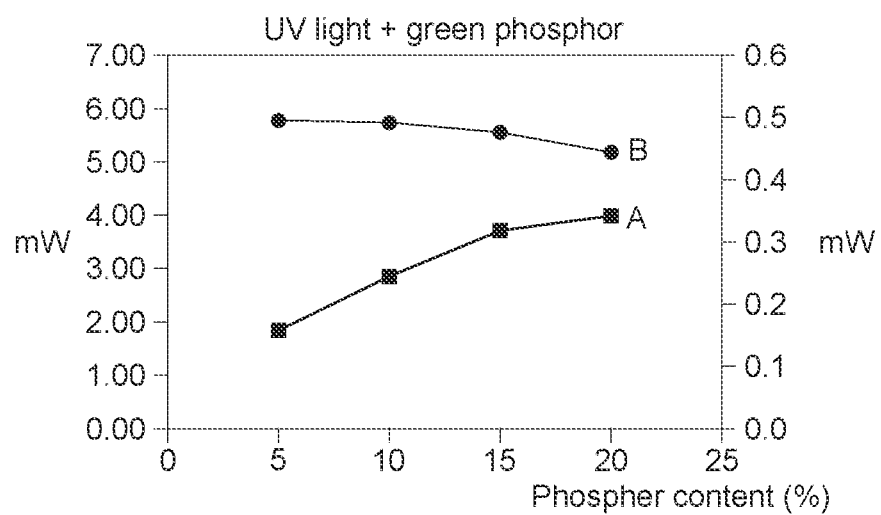
FIG. 3B is a comparison diagram of spectral energies and ratio between an invisible light and a visible light of a light emitting device with different contents of green phosphor.
Figure 3B:
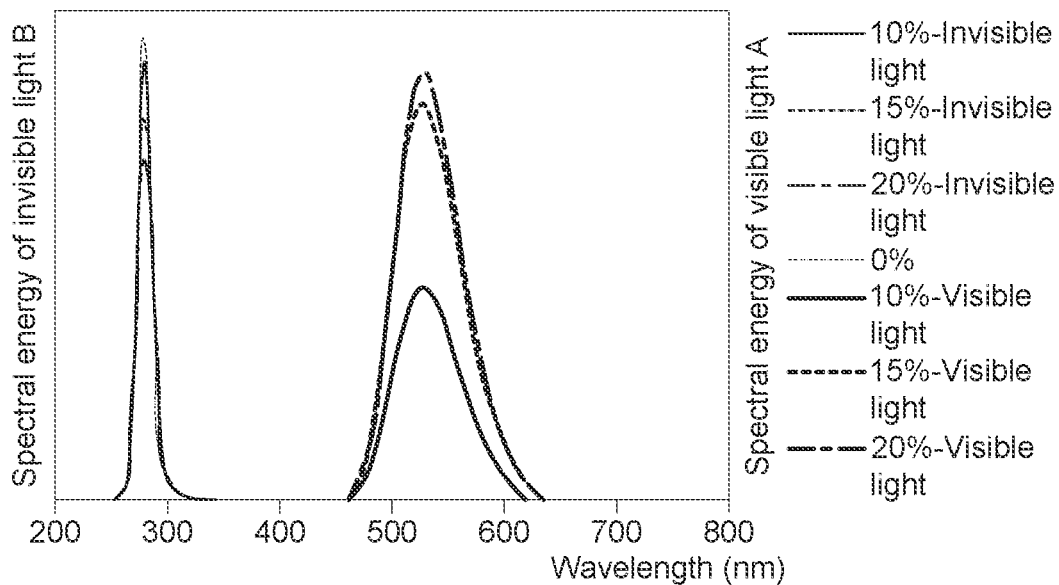

FIG. 3B is a comparison diagram of spectral energy and ratio between an invisible light and a visible light emitted by a light emitting device 100 with different contents of green phosphor. As indicated in FIG. 3B, green phosphor can absorb the light energy of UV light waveband to generate a green light. When the content of green phosphor respectively is 5%, 10%, 15%, 20%, the ratio (A/B) of the spectral energy A of the visible light (green light) to the spectral energy B of invisible light is about 2.75%, 4.20%, 5.66%, 6.60%. When the green phosphor is used, the ratio (A/B) of the spectral energy A of visible light to the spectral energy B of invisible light is controlled to be under 6% according to the phosphor content. In other words, the spectral energy of UV light is at least 15 times of the spectral energy of green light, and preferably more than 20 times. Preferably, the content of green phosphor is in a range of 5% to 25%.

Figure 3C:
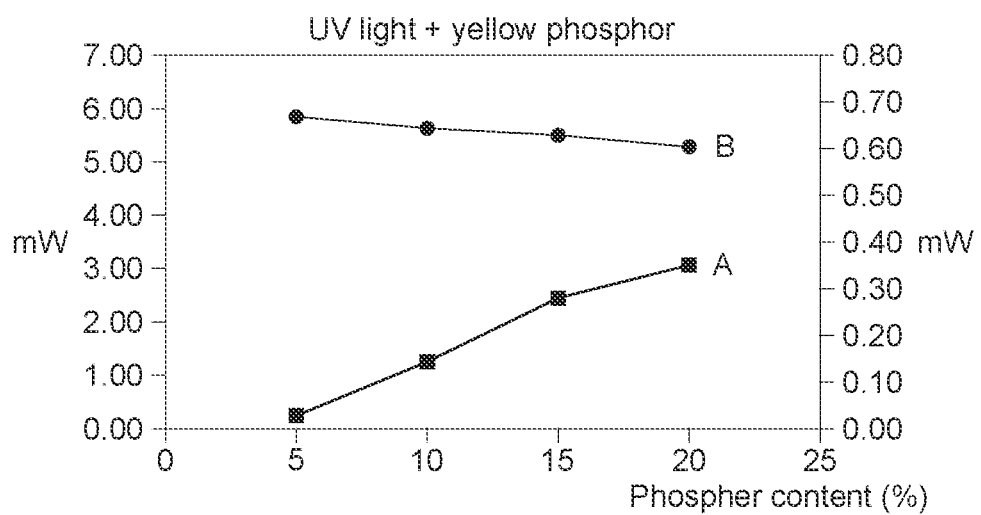
FIG. 3C is a comparison diagram of spectral energies and ratio between an invisible light and a visible light of a light emitting device with different contents of yellow phosphor.
Figure 3C:
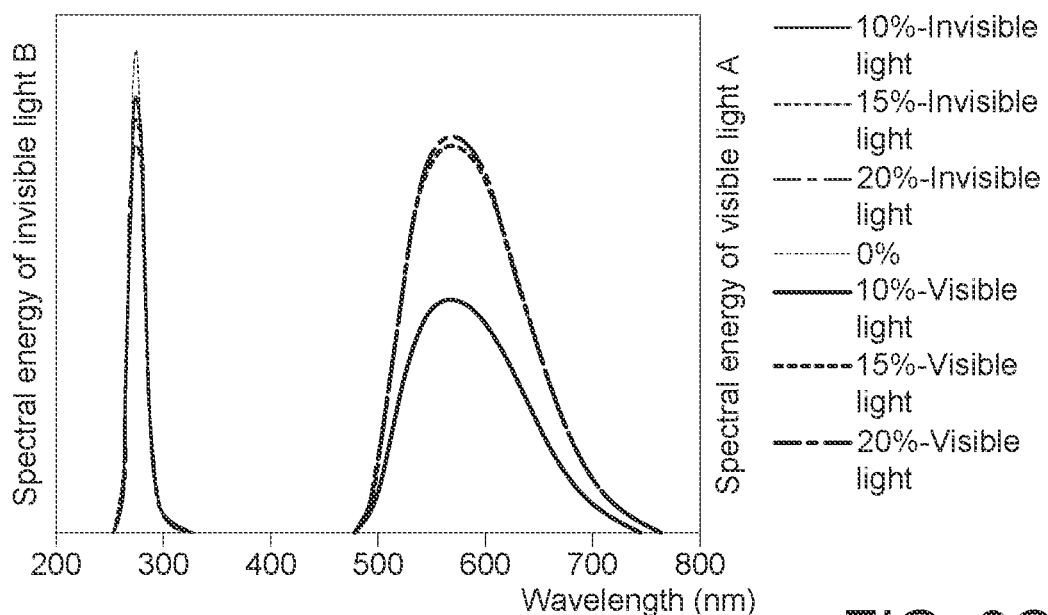

FIG. 3C is a comparison diagram of spectral energies and ratios between an invisible light and a visible light of a light emitting device 100 with different contents of yellow phosphor. As indicated in FIG. 3C, yellow phosphor can absorb the light energy of UV light waveband to generate a yellow light. When the content of yellow phosphor respectively is 5%, 10%, 15%, 20%, the ratio (A/B) of the spectral energy A of the visible light (yellow light) to the spectral energy B of invisible light is about 0.51%, 2.47%, 5.09%, 6.43%. When the yellow phosphor is used, the ratio (A/B) of the spectral energy A of visible light to the spectral energy B of invisible light is controlled to be under 7% according to the phosphor content. In other words, the spectral energy of UV light is at least 15 times of the spectral energy of yellow light, and preferably more than 35 times. Preferably, the content of yellow phosphor is in a range of 5% to 35%.

Figure 3D:
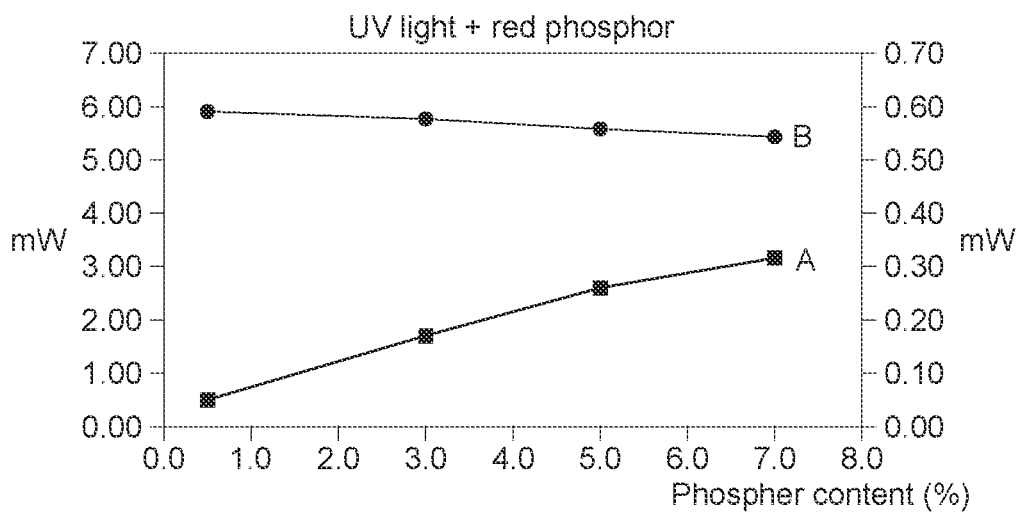
FIG. 3D is a comparison diagram of spectral energies and ratio between an invisible light and a visible light of a light emitting device with different contents of red phosphor.
Figure 3D:
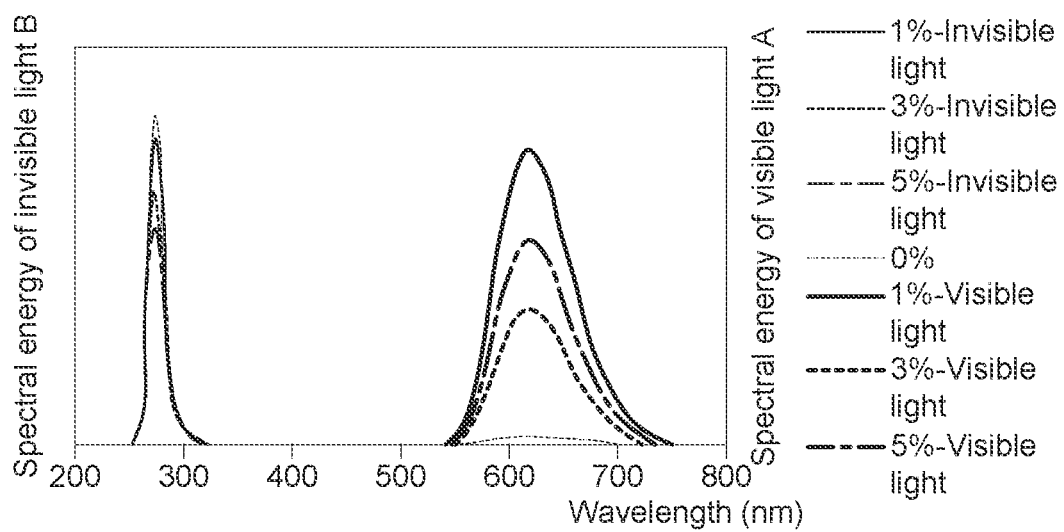

FIG. 3D is a comparison diagram of spectral energies and ratios between an invisible light and a visible light of the light emitting device 100 with different contents of red phosphor. As indicated in FIG. 3D, red phosphor can absorb the light energy of UV light waveband to generate a red light. When the content of red phosphor respectively is 0.5%, 3%, 5%, 7%, the ratio (A/B) of the spectral energy A of the visible light (red light) to the spectral energy B of invisible light is about 0.86%, 2.96%, 4.62%, 5.83%. When the red phosphor is used, the ratio (A/B) of the spectral energy A of visible light to the spectral energy B of invisible light is controlled to be under 6% according to the phosphor content. In other words, the spectral energy of UV light is at least 15 times of the spectral energy of red light, and preferably more than 30 times. Preferably, the content of red phosphor is in a range of 1.5% to 10%.

According to the present embodiment, the light emitting device with a predetermined content of phosphor can absorb light energy and convert a part of invisible light (such as deep ultraviolet light) into visible light, and output the remaining part of invisible light and a small amount of visible light via a light outputting plane. The visible light indicates that the lighting unit is in operation. The said arrangement can reduce cost, heat generation and power consumption of LED. Moreover, the reflective layer of the light emitting device of the present embodiment can reflect the light with specific wavelength, hence avoiding light loss and increasing the spectral energy of the lighting unit. In comparison to the conventional light emitting device, the light emitting device of the present embodiment increases light utilization and provides better practicality.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light emitting device, comprising:
a lighting unit configured to emit an invisible light;
a conversion material configured to convert a small part of the invisible light into a visible light for indicating that the lighting unit is in operation,
wherein, a wavelength range of the light emitted by the light emitting device covers both wavelength ranges of the visible light and the invisible light, and a spectral energy measured within the wavelength range of the visible light is less than 20% of a spectral energy measured within a wavelength range of 200 nm to 380 nm of remaining part of the invisible light.

2. The light emitting device according to claim 1, wherein a phosphor content in the conversion material is 1.5% to 35%, and the spectral energy measured within the wavelength range of the visible light is 0.5% to 20% of the spectral energy measured within the wavelength range of remaining part of invisible light.

3. The light emitting device according to claim 2, wherein the conversion material contains a phosphor, when the phosphor is a blue phosphor, the phosphor content is 5% to 30%; when the phosphor is a green phosphor, the phosphor content is 5% to 25%; when phosphor is a yellow phosphor, the phosphor content is 5% to 35%; when phosphor is a red phosphor, the phosphor content is 1.5% to 10%.

4. The light emitting device according to claim 1, wherein the conversion material is at least one compound selected from a group composed of $(Sr,Ba)_{10}(PO_4)_6Cl_2$:Eu; $(Ba,Sr,Ca)_2SiO_4$:Eu$^{2+}$; $Tb_3Al_5O_{12}$:Ce$^{3+}$; $(Sr,Ca)AlSiN_3$: Eu.

5. The light emitting device according to claim 2, wherein the conversion material further contains an encapsulant whose material is selected from polydimethylsiloxane or fluorine polymer.

6. The light emitting device according to claim 1, wherein the light emitting device further comprises a substrate, a cover plate, a casing and a reflective layer, the cover plate covers the lighting unit, the casing is interposed between the substrate and the cover plate, the reflective layer is disposed on an inner-wall of the casing, and the reflective layer has a reflectivity against the visible light greater than or equivalent to a reflectivity against the invisible light.

7. The light emitting device according to claim 6, wherein the reflective layer is formed of silver or gold, or the reflective layer is a Bragg reflector.

8. The light emitting device according to claim 1, wherein a pattern of the invisible light provided by the lighting unit is a batwing shape.

9. The light emitting device according to claim 8, wherein the lighting unit has a carrier, the thickness of the carrier is 250-600 nm.

10. The light emitting device according to claim 1, wherein the conversion material surrounds the lighting unit.

11. The light emitting device according to claim 10, wherein the lighting unit has a carrier, a first semiconductor layer, a light emitting layer and a second semiconductor layer arranged in order, a position of the conversion material is higher than the light emitting layer and lower than a top surface of the carrier.

12. The light emitting device according to claim 10, wherein the conversion material contains a first portion and a second portion, the first portion surrounds the lighting unit, the second portion is disposed on a top surface of the lighting unit, and a part of the first portion is lower than the top surface of the lighting unit.

13. An invisible light emitting device, comprising:
a lighting unit configured to emit a first light; and
a conversion material surrounding the lighting unit and having an excitation spectrum, wherein when a small part of the first light enters the conversion material, the conversion material converts the small part of the first light into a second light;
wherein the first light is an invisible light, the second light is a visible light, a spectral energy of remaining part of the first light is at least 5 times of a spectral energy of the second light.

14. The invisible light emitting device according to claim 13, wherein the conversion material contains a phosphor and an encapsulant, the excitation spectrum of the phosphor falls within a range of 200-380 nm, the emission spectrum of the phosphor falls within a range of 380-780 nm, and the phosphor content in the conversion material is under 20%.

15. The invisible light emitting device according to claim 13, wherein the spectral energy of the second light is larger than 0.1 mW, and the spectral energy of remaining part of the first light is at least 15 times of the spectral energy of the second light.

16. The invisible light emitting device according to claim 13, wherein the second light is blue light, the spectral energy of the second light is larger than 0.3 mW, and the spectral energy of remaining part of the first light is more than 7.5 times of the spectral energy of the second light.

17. The invisible light emitting device according to claim 13, wherein the spectral energy of the first light at normal line is less than the spectral energies of the light at the two lateral sides.

18. The invisible light emitting device according to claim 17, wherein the lighting unit has a carrier, the thickness of the carrier is 250-600 nm.

19. The invisible light emitting device according to claim 13, further comprises a substrate and a casing, the casing and the substrate define an accommodating space for accommodating the lighting unit and the conversion material.

20. The invisible light emitting device according to claim 19, wherein the conversion material contains a first portion and a second portion, the first portion surrounds the lighting unit, the second portion is disposed on a top surface of the lighting unit, a top surface of the second portion is a curved surface and has a curvature center located outside the accommodating space, a highest point of the first portion is located at a junction between the conversion material and the casing, a lowest point of the first portion is located at a position from 25% to 90% of a thickness of the lighting unit.

* * * * *